(12) United States Patent
Easton et al.

(10) Patent No.: US 12,007,876 B2
(45) Date of Patent: Jun. 11, 2024

(54) MANAGEMENT AND DEVELOPMENT OF MODIFICATIONS WITHIN A SOURCE CODE

(71) Applicant: International Business Machines Corporation, Armonk, NY (US)

(72) Inventors: John Paul Easton, Bradley (GB); Gregory R. Hintermeister, Rochester, MN (US); Karri Carlson-Neumann, Rochester, MN (US); Zoe Clements, Hailsham (GB); Vishal Anand, Dublin (IE)

(73) Assignee: International Business Machines Corporation, Armonk, NY (US)

( * ) Notice: Subject to any disclaimer, the term of this patent is extended or adjusted under 35 U.S.C. 154(b) by 93 days.

(21) Appl. No.: 17/660,646

(22) Filed: Apr. 26, 2022

(65) Prior Publication Data
US 2023/0342284 A1 Oct. 26, 2023

(51) Int. Cl.
*G06F 11/36* (2006.01)
*G06F 8/41* (2018.01)
(Continued)

(52) U.S. Cl.
CPC ...... *G06F 11/3664* (2013.01); *G06F 11/3457* (2013.01); *G06F 11/3612* (2013.01);
(Continued)

(58) Field of Classification Search
CPC ............. G06F 11/3664; G06F 11/3457; G06F 11/3612; G06F 11/3692; G06F 11/3409;
(Continued)

(56) References Cited

U.S. PATENT DOCUMENTS 10,289,539 B1 * 5/2019 Arguelles ............ G06F 11/3664
10,635,566 B1 4/2020 Talluri
(Continued)

OTHER PUBLICATIONS

Joao A. Duraes et al., Emulation of Software Faults: A Field Data Study and a Practical Approach, Nov. 2006, [Retrieved on Mar. 27, 2024]. Retrieved from the internet: < URL: https://ieeexplore.ieee.org/stamp/stamp.jsp?tp=&arnumber=4015509> 19 Pages (849-867) (Year: 2006).*

*Primary Examiner* — Anibal Rivera
(74) *Attorney, Agent, or Firm* — Joseph P. Curcuru (57) ABSTRACT

In an approach to improve implementing program code modifications within a predetermined system embodiments simulate an impact of an implemented modification to a software code against one or more predetermined constraints using a target environment. Further, embodiments comparing a first executed simulation against a second executed simulation of the software code, wherein the second executed simulation comprises the implemented modifications and a current version of the software code. Additionally, embodiments, generate guidance for a user based on the comparison of the first and second executed simulations, wherein the generated guidance comprises positive and negative impacts of the implemented software code modifications regarding compliance with the one or more predetermined constraints, and output, by a user interface, the generated guidance to the user detailing the impact of the implemented modification.

20 Claims, 4 Drawing Sheets

(51) Int. Cl.
*G06F 8/65* (2018.01)
*G06F 8/71* (2018.01)
*G06F 11/34* (2006.01)
*G06F 8/60* (2018.01)
*G06F 8/77* (2018.01)
*G06F 11/07* (2006.01)
*G06F 11/14* (2006.01)

(52) U.S. Cl.
CPC ............... *G06F 8/60* (2013.01); *G06F 8/77* (2013.01); *G06F 11/079* (2013.01); *G06F 11/1433* (2013.01); *G06F 11/3409* (2013.01); *G06F 11/3419* (2013.01); *G06F 11/3433* (2013.01); *G06F 11/3692* (2013.01)

(58) Field of Classification Search
CPC ........... G06F 11/3419; G06F 11/079; G06F 11/1433; G06F 11/3433; G06F 8/60; G06F 8/77
See application file for complete search history.

(56) References Cited

U.S. PATENT DOCUMENTS

| | | | |
|---|---|---|---|
| 10,891,219 B1* | 1/2021 | Dimitropoulos | A63F 13/352 |
| 11,755,919 B2* | 9/2023 | Vidal | G06F 11/3664 |
| | | | 706/25 |
| 2007/0234299 A1* | 10/2007 | Watanabe | G06F 11/3476 |
| | | | 717/124 |
| 2016/0170747 A1 | 6/2016 | Luettge | |
| 2020/0034135 A1 | 1/2020 | Shi | |
| 2020/0125485 A1* | 4/2020 | Wiener | G06F 11/3688 |
| 2021/0042216 A1* | 2/2021 | Magnezi | G06F 8/658 |
| 2021/0149666 A1 | 5/2021 | Goern | |
| 2021/0390028 A1* | 12/2021 | Schmitz | G06F 11/3688 |
| 2022/0276953 A1* | 9/2022 | Padala | G06F 11/3433 |
| 2022/0342846 A1* | 10/2022 | Kunchakarra | G06N 20/00 |
| 2023/0086361 A1* | 3/2023 | Wan | G06F 11/1433 |
| | | | 702/186 |
| 2023/0176847 A1* | 6/2023 | Ben-Moshe | G06F 8/443 |
| | | | 717/168 |

* cited by examiner

MANAGEMENT AND DEVELOPMENT OF MODIFICATIONS WITHIN A SOURCE CODE

BACKGROUND OF THE INVENTION

The present invention relates generally to the field of program code development and more particularly to simulating and implementing program code modifications within a predetermined system.

Software development is the process of conceiving, specifying, designing, programming, documenting, testing, and debugging involved in creating and maintaining applications, frameworks, or other software components. Software development involves writing and maintaining the source code, but in a broader sense, it includes all processes from the conception of the desired software through to the final manifestation of the software, typically in a planned and structured process. Software development also includes research, new development, prototyping, modification, reuse, re-engineering, maintenance, or any other activities that result in software products. Further, software development refers to a set of computer science activities dedicated to the process of creating, designing, deploying and supporting software. Additionally, software itself is the set of instructions or programs that tell a computer what to do. It is independent of hardware and makes computers programmable. There are three basic types of software: (i) system software, which provides core functions such as operating systems, disk management, utilities, hardware management and other operational necessities, (ii) programming software, which gives programmers tools such as text editors, compilers, linkers, debuggers and other tools to create code, and (iii) application software (applications or apps) that helps users perform tasks. Office productivity suites, data management software, media players and security programs are examples.

SUMMARY

Embodiments of the present invention disclose a computer-implemented method, a computer program product, and a system for simulating and implementing program code modifications within a predetermined system, the computer-implemented method comprising: simulating an impact of an implemented modification to a software code against one or more predetermined constraints using a target environment, comparing a first executed simulation against a second executed simulation of the software code, wherein the second executed simulation comprises the implemented modifications and a current version of the software code, generating guidance for a user based on the comparison of the first and second executed simulations, wherein the generated guidance comprises positive and negative impacts of the implemented software code modifications regarding compliance with the one or more predetermined constraints, and outputting, by a user interface, the generated guidance to the user detailing the impact of the implemented modification.

DETAILED DESCRIPTION

Embodiments of the present invention recognize that computer code may be created to solves a particular problems; however, the potential implications of the programming language, technique, or approach may not be considered. Further, embodiments of the present invention recognize that as organizations become more concerned with improving technology and the world (e.g., corporate social responsibilities and the drive to lower costs and carbon economies, and various other ventures and topics). Further, embodiments of the present invention recognize that choices that impact said goals include: being cost conscious with resources, running code on the most cost-effective platform, ensuring portability of code, attaining high service levels for mission critical apps, and more recently reducing the carbon footprint of information technology (IT). Further, embodiments of the present invention recognize that one particular issue in the art is that project constraints (code requirements) need to be made and kept aware of by the user when developing a program code. Embodiments of the present improve the art and solve particular problems in the art by (i) simulating the impact of code changes against one or more IT goals using a target environment, (ii) providing guidance to the developer when changes to the code positively and/or negatively impact the efficiency of a goal, (iii) highlighting identified potential challenges, and (iv) enabling the developer to address the identified potential challenges early in the development lifecycle.

Implementation of embodiments of the invention may take a variety of forms, and exemplary implementation details are discussed subsequently with reference to the Figures (i.e., FIG. 1A-FIG. 3).

Figure 1A:
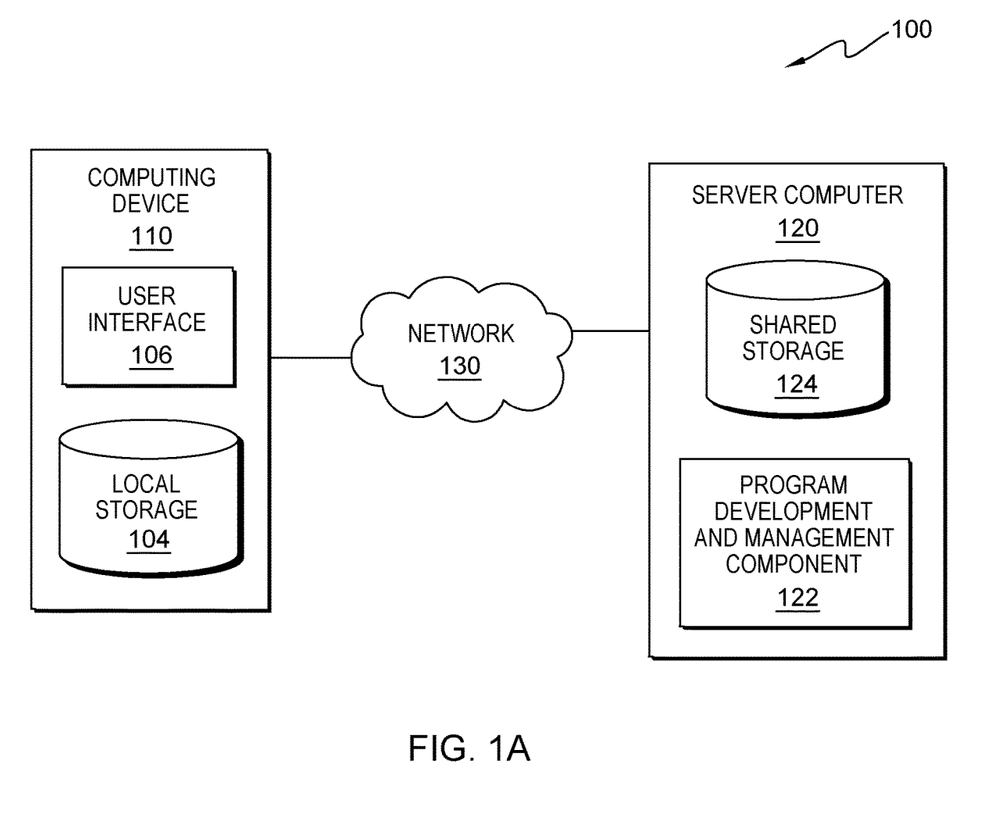
FIG. 1A is a functional block diagram illustrating a distributed data processing environment, in accordance with an embodiment of the present invention.

FIG. 1A is a functional block diagram illustrating a distributed data processing environment, generally designated 100, in accordance with one embodiment of the present invention. The term "distributed" as used in this specification describes a computer system that includes multiple, physically distinct devices that operate together as a single computer system. FIG. 1A provides only an illustration of one implementation and does not imply any limitations with regard to the environments in which different embodiments may be implemented. Many modifications to the depicted environment may be made by those skilled in the art without departing from the scope of the invention as recited by the claims. Distributed data processing environment 100 includes computing device 110 and server computer 120 interconnected over network 130.

Network 130 may be, for example, a storage area network (SAN), a telecommunications network, a local area network (LAN), a wide area network (WAN), such as the Internet, a wireless technology for exchanging data over short distances (using short-wavelength ultra-high frequency (UHF) radio waves in the industrial, scientific and medical (ISM) band from 2.4 to 2.485 GHz from fixed and mobile devices, and building personal area networks (PANs) or a combination of the three), and may include wired, wireless, or fiber optic connections. Network 130 may include one or more wired and/or wireless networks that may receive and transmit data, voice, and/or video signals, including multimedia signals that include voice, data, text and/or video data. In general, network 130 may be any combination of connections and protocols that will support communications between computing device 110 and server computer 120, and any other computing devices and/or storage devices (not shown in FIG. 1A) within distributed data processing environment 100.

In some embodiments of the present invention, computing device 110 may be, but is not limited to, a standalone device, a client, a server, a laptop computer, a tablet computer, a netbook computer, a personal computer (PC), a smart phone, a desktop computer, a smart television, a smart watch, a radio, a stereo system, a cloud based service (e.g., a cognitive cloud based service), AR glasses, a virtual reality headset, any HUD known in the art, and/or any programmable electronic computing device capable of communicating with various components and devices within distributed data processing environment 100, via network 130 or any combination therein. In general, computing device 110 may be representative of any programmable computing device or a combination of programmable computing devices capable of executing machine-readable program instructions and communicating with users of other computing devices via network 130 and/or capable of executing machine-readable program instructions and communicating with server computer 120. In some embodiments computing device 110 may represent a plurality of computing devices.

In some embodiments of the present invention, computing device 110 may represent any programmable electronic computing device or combination of programmable electronic computing devices capable of executing machine readable program instructions, manipulating executable machine-readable instructions, and communicating with server computer 120 and other computing devices (not shown) within distributed data processing environment 100 via a network, such as network 130. Computing device 110 may include an instance of user interface (interface) 106, and local storage 104. In various embodiments, not depicted in FIG. 1A, computing device 110 may have a plurality of interfaces 106. In other embodiments, not depicted in FIG. 1A, distributed data processing environment 100 may comprise a plurality of computing devices, plurality of server computers, and/or one a plurality of networks. Computing device 110 may include internal and external hardware components, as depicted, and described in further detail with respect to FIG. 3.

User interface (interface) 106 provides an interface to program development and management component (component) 122. Computing device 110, via user interface 106, may enable a user and/or a client to interact with component 122 and/or server computer 120 in various ways, such as sending program instructions, receiving program instructions, sending and/or receiving messages, updating data, sending data, inputting data, editing data, collecting data, and/or receiving data. In one embodiment, interface 106 may be a graphical user interface (GUI) or a web user interface (WUI) and may display at least text, documents, web browser windows, user options, application interfaces, and instructions for operation. interface 106 may include data (such as graphic, text, and sound) presented to a user and control sequences the user employs to control operations. In another embodiment, interface 106 may be a mobile application software providing an interface between a user of computing device 110 and server computer 120. Mobile application software, or an "app," may be designed to run on smart phones, tablet computers and other computing devices. In an embodiment, interface 106 may enable the user of computing device 110 to at least send data, input data, edit data (annotations), collect data and/or receive data.

Server computer 120 may be a standalone computing device, a management server, a web server, a mobile computing device, one or more client servers, or any other electronic device or computing system capable of receiving, sending, and processing data. In other embodiments, server computer 120 may represent a server computing system utilizing multiple computers such as, but not limited to, a server system, such as in a cloud computing environment. In another embodiment, server computer 120 may represent a computing system utilizing clustered computers and components (e.g., database server computers, application server computers, etc.) that act as a single pool of seamless resources when accessed within distributed data processing environment 100. Server computer 120 may include internal and external hardware components, as depicted, and described in further detail with respect to FIG. 3. In some embodiments server computer 120 may represent a plurality of server computers.

Each of shared storage 124 and local storage 104 may be a data/knowledge repository and/or a database that may be written and/or read by one or a combination of component 122, server computer 120 and computing device 110. In some embodiments, each of shared storage 124 and local storage 104 may be a data/knowledge repository, a knowledge base, a knowledge center, a knowledge corpus, and/or a database that may be written and/or read by one or a combination of component 122, server computer 120 and computing device 110. In the depicted embodiment, shared storage 124 resides on server computer 120 and local storage 104 resides on computing device 110. In another embodiment, shared storage 124 and/or local storage 104 may reside elsewhere within distributed data processing environment 100, provided that each may access and is accessible by computing device 110 and server computer 120. Shared storage 124 and/or local storage 104 may each be implemented with any type of storage device capable of storing data and configuration files that may be accessed and utilized by server computer 120, such as, but not limited to, a database server, a hard disk drive, or a flash memory. In various embodiments, not depicted in FIG. 1A, in addition to shared storage 124, server computer comprises a primary and a secondary database, described below in FIG. 3. The primary database, also referred to as primary storage device, may be one or more of any type of disk storage known in the art. The secondary database, also referred to as secondary storage device, may be one or more any type of tape storage known in the art.

In the depicted embodiment, component 122 is executed on server computer 120. In other embodiments, component 122 may be executed on computing device 110. In various embodiments of the present invention, not depicted in FIG. 1A, component 122 may execute on a plurality of server computers 120 and/or on a plurality of computing devices 110. In some embodiments, component 122 may be located and/or executed anywhere within distributed data processing environment 100 as long as component 122 is connected to and/or communicates with, computing device 110, and/or server computer 120, via network 130. In various embodiments, not depicted in FIG. 1A, component 122 comprise various components (see FIG. 1B).

In various embodiments, component 122 simulates and predicts the impact of developed software code on one or more predetermined constraints (e.g., higher level business/information technology (IT) goals). More specifically, component 122 may improve the art and solve the issues stated above by (i) simulating the impacts of the software code changes against one or more predetermined constraints using a target environment, (ii) providing guidance and/or feedback to a user regarding positive and negative impacts of implemented software code modifications regarding compliance with the predetermined constraints, (iii) highlighting challenges with the present software code and/or the implemented modifications to the present software code, (iv) and enabling the user to address the highlighted challenges early in the development lifecycle of the code.

In various embodiments, component 122 comprises a pluggable nature that enables versatility and use on various areas and industries (e.g., energy consumption and other constraints known in the art). Further, in various embodiments, component 122 executes simulations in both a single system and a cloud environment, wherein the generated simulation is used to determine the impact (e.g., performance implications) of the code modification.

Figure 1B:
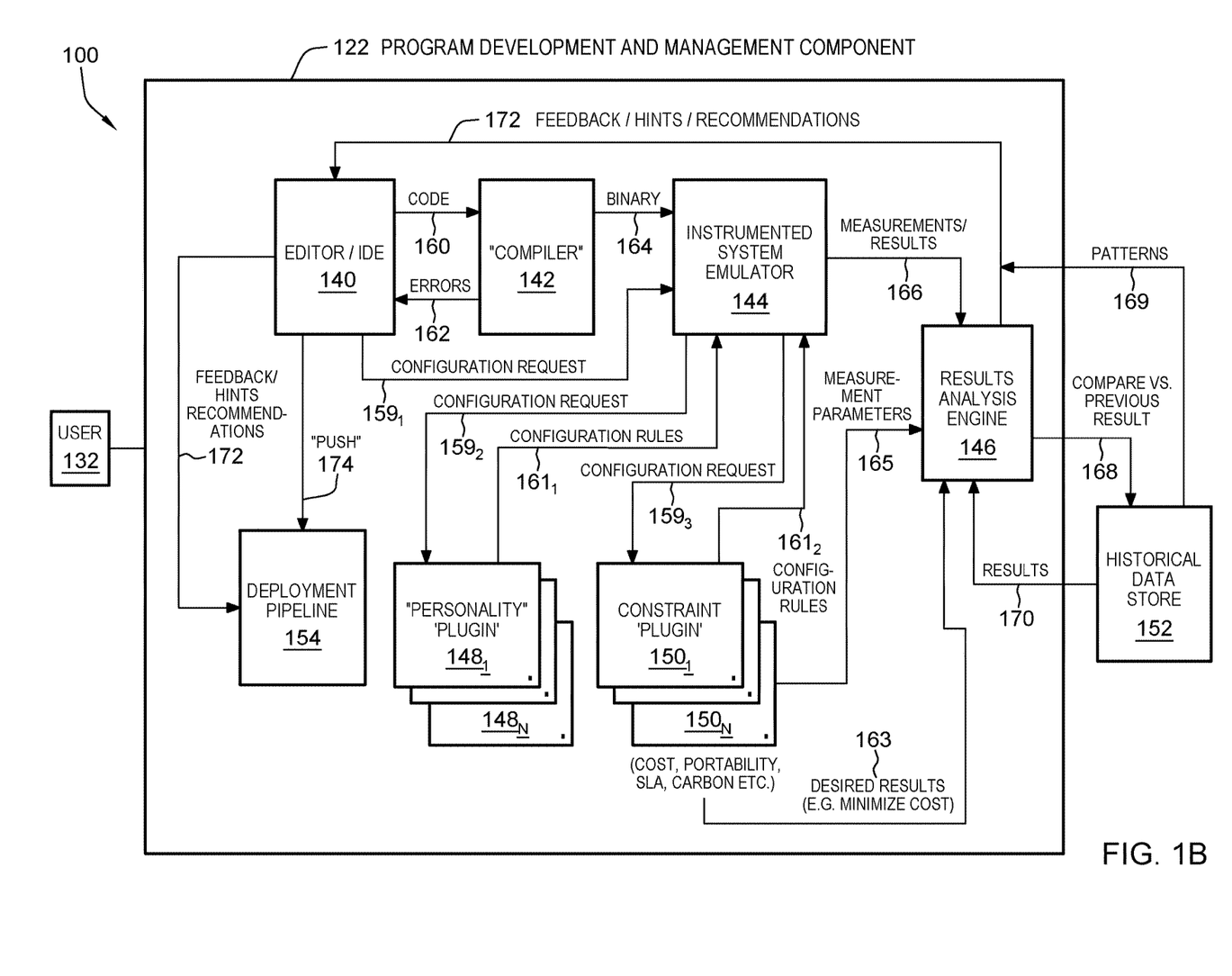
FIG. 1B is a functional block diagram illustrating a distributed data processing environment of a program development and management component, in accordance with an embodiment of the present invention.

FIG. 1B is a functional block diagram illustrating a distributed data processing environment, generally designated 100, in accordance with one embodiment of the present invention. The term "distributed" as used in this specification describes a computer system that includes multiple, physically distinct devices that operate together as a single computer system. FIG. 1B provides only an illustration of one implementation and does not imply any limitations with regard to the environments in which different embodiments may be implemented. Many modifications to the depicted environment may be made by those skilled in the art without departing from the scope of the invention as recited by the claims.

In one example a user (i.e., developer) creates a new program to run in a predetermined cloud computing environment, on a predetermined processor architecture, and using predetermined programming language. In the depicted embodiment, based on the details in the example above, component 122 executes or receives instructions to execute, Integrated Development Environment (IDE) 140, wherein IDE 140 receives instructions to submit configuration request 1591 to Instrumented System Emulator (ISE) 144. In some embodiments, not depicted in FIG. 1B, IDE 140 comprises an editor. In the depicted embodiment, IDE 140 submits configuration request 1591 to ISE 144 so that ISE 144 is configured to match the predetermined code requirements (i.e., constraints). Predetermined constraints may be, but are not limited to, requirements to maximize portability of the software code, to minimize runtime costs, to minimize the energy consumption (and potentially carbon footprint) of the running code), requirements such as maximizing accessibility for people with disabilities, minimizing information technology (IT) resource requirements (compute, storage, network bandwidth, and/or other IT resources known in the art).

In various embodiments, creating a program code to "minimize the cost" of running a particular program code may be a code requirement. Continuing the example using the depicted embodiment, compiler 142 compiles the edits executed by an editor withing IDE 140, wherein if the if the compilation is unsuccessful then errors 162 are returned to the (user), via computing device 110 to fix and/or adjust. However, in the depicted embodiment, if the compilation by compiler 142 is successful, then compiler 142 sends a generated binary code (binary 164) to Instrumented System Emulator (ISE) 144 where binary 164 is run and system measurements resulting from running this are captured by component 122 via ISE 144. In various embodiments if the compilation by compiler 142 is successful, then compiler 142 generates binary 164 and sends binary 164 to ISE 144 to be executed.

ISE 144 may be configured using "plugins" as they are known and understood in the art. The first set of plugins are those that define what sort of system is being emulated. In the depicted embodiment, ISE 144 is configured by personality plugin $148_{1-N}$, herein personality plugin(s) 148, and constraint plugin $150_{1-N}$, herein constraint plugin(s) 150. As used herein, N represents a positive integer, and accordingly the number of scenarios implemented in a given embodiment of the present invention is not limited to those depicted in FIG. 1. Personality plugin(s) 148 enable the system to emulate different processor architectures, operating systems, and other various systems known and understood in the art. In the depicted embodiment, ISE 144 submits a configuration request $159_2$ to personality plugin(s) 148, wherein in response to receiving configuration request $159_2$, ISE 144 receives configuration rules $161_1$. Constraint plugin(s) 150 defines elements in the system that have been flagged and/or identified for measurement within ISE 144. In the depicted embodiment, ISE 144 submits a configuration request $159_3$ to constraint plugin(s) 150, wherein in response to receiving configuration request $159_3$, ISE 144 receives configuration rules $161_2$, and results analysis engine 146 receives desired results 163 and measuring parameters 165. For example, if one of the constraints that has been chosen is, "Carbon Footprint" then ISE 144 will measure energy consumption resulting from the execution of the binary. This energy consumption data can then be used to calculate a Carbon footprint for the execution of the binary.

More specifically, ISE 144 uses the plugins (e.g., personality plugin(s) 148 and constraint plugin(s) 150) to understand what environment is being emulated, which may comprise processor type, clock speed, operating system, and/or any other computing environmental constrains known and understood in the art. in various embodiments, component 122 simulates the behavior of the target system that the code (e.g., code 160) may run on based on the understanding of the environments vis ISE 144 and personality plugin(s) 148 and constraint plugin(s) 150. Moreover, binary 164 runs in ISE 144, wherein ISE 144 collects metrics of binary 164 as binary 164 runs. The metrics that are collected will vary depending upon the requirements/constraints that are important to the business.

For example, assuming there is an interest in energy consumption of the code. In this particular scenario, energy consumption by the real system being emulated would be a desired measurement, wherein component 122 identifies the energy that is consumed by each instruction in the binary and measures the total energy consumption of binary 164 by calculating the consumption of all the instructions being run. Further, if a constraint (i.e., predetermined constraint) is "cost", component 122 utilizes financial data. For example, the cost per hour for the size of the system being emulated and measures the relative consumption of that system (e.g., 35% of the total capacity of the system) as the binary (binary 164) runs. The financial cost of the binary can then be calculated from the identified and measured metrics generated by ISE 144 while binary 164 is running. In a different instance, if the previous version of the binary is considered/measured then component 122 may have measured the requirement (cost, energy, and/or portability) as X. When component 122 runs the current version of the binary the value measured may be X+Y, wherein component 122, via IDE 140 that the code modifications had a negative impact or positive impact. In some embodiments, a negative impact may be indicated by a "larger" number/value and a positive impact is indicated by a lower number/value, wherein the base number for the lower and higher number/value is predetermined. In other embodiments, negative impact or positive impact of the code modifications are based on predetermined values and/or thresholds.

In the depicted embodiment, as binary 164 is executing, measurements and results 166 are generated by ISE 144, wherein results analysis engine 146 receives measurements and results 166 from ISE 144. In the depicted embodiment, the interaction between ISE 144 and results analysis engine, regarding measurements and results 166, works in conjunction with historical data store 152, wherein historical data store 152 compares the current execution of the binary in the ISE with previous executions (i.e., compares previous results 168). Further, in the depicted embodiment, historical data store 152 generates and outputs results associated with current and previous binary executions by ISE 144 (results 170) to results engine 146. The generation and output of the binary execution comparison enables the measurements taken for an execution to be evaluated as more or less positive compared to the previous execution with respect to the one or more predetermined constraints. Component 122, via IDE 140, ISE 144, results analysis engine, and historical data store 152, simulates the behavior of the implemented code modification (i.e., purposed code modification) to understand the difference between the current and previous versions of the code (e.g., binary 164).

In the depicted embodiment, results 170 of this comparison are sent back to IDE 140 to provide immediate guidance (feedback and recommendations 172) to a user (e.g., developer), which enables the user to directly see the results of their recent code changes to comply with one or more predetermined constraints. Further, in the depicted embodiment, historical data store 152 identifies patterns 169 between the current and previous executions of binary 164 and outputs step by step guidance while conducting a comparison of current and previous executions of binary 164. In some embodiments, each binary 164 generated by compiler 142 comprises a unique identifier to enable the identification of each version of binary 164. In various embodiments, the output feedback and recommendations (e.g., guidance) may comprise patterns 169. Additionally, in various embodiments, the output feedback and recommendations/guidance (feedback and recommendations 172) comprise a weighted score based on predetermined measurements that creates a numerical visualization of how compliant the current version of the code based on the current modifications is to satisfy the predetermined constraints (e.g., the current version is 80% compliant with the predetermined constraints). In some embodiments, generated and output weighted score can be a range. In other embodiments, the generated and output weighted score can be based on a predetermined threshold, wherein if the generated weighted score is above the predetermined threshold component 122 automatically accepts the changes and issues a notification prompt to the user that the modifications are compliant; however, it the generates weighted score is below the predetermined threshold then component 122 outputs an error message and/or responsive prompt notifying the user to correct the issue and outputs recommendations of how the user to bring the modifications and/or the code into compliance with the predetermined constraints.

In various embodiments, component 122 enables the user to modify the implemented changes that were recently made or save said implemented changes based on received feedback and recommendations 172. In various embodiments, component 122 generates and outputs a responsive prompt to a user, via interface 106, based on feedback and recommendations 172, wherein the responsive prompt comprises one or more prompts querying the user to accept, modify, and/or cancel the implemented modifications to the code. In some embodiments, the responsive prompt may ask the user to submit custom feedback on received feedback and recommendations 172. In the depicted embodiments, responsive to receiving confirmation, via interface 106, from the user that the changes/modifications have been accepted, component 122, via IDE 140 push the code (push 174) through to the CI/CD pipelines (deployment pipeline 154) for deployment to the next stage of the development process, wherein feedback and recommendations 172 from the Results Analysis Engine 146, sent via the IDE 140, are used to reconfigure deployment pipeline 154 to enable deployment pipeline 154 to optimize the deployment of the code to the target platform (or to a different platform if that was the recommendation made by results and analysis engine 146).

In various embodiments, results may be used to make recommendations to the user (e.g., developer). For example, usage by the code of a given API that is only available on one cloud platform may limit code portability, a recommendation may be made to review this choice and select an alternative that allows for greater portability. In another example, an algorithm that the code is using has not been well implemented by the developer, which gives rise to excessive use of system resources which in turn drive up energy consumption (and hence potential carbon footprint). In this example, the developer is notified that the algorithm is a potential source of excessive computation and recommends that the developer reconsider how the algorithm has been implemented. In a different example, the code is calling functionality that is only available in a paid version of a cloud service rather than a free version but is not making use of said functionality, wherein the usage of said functionality doesn't justify the use of a chargeable version so a recommendation may be made to re-code to avoid the need for a chargeable version, thus reducing cost.

Figure 2:
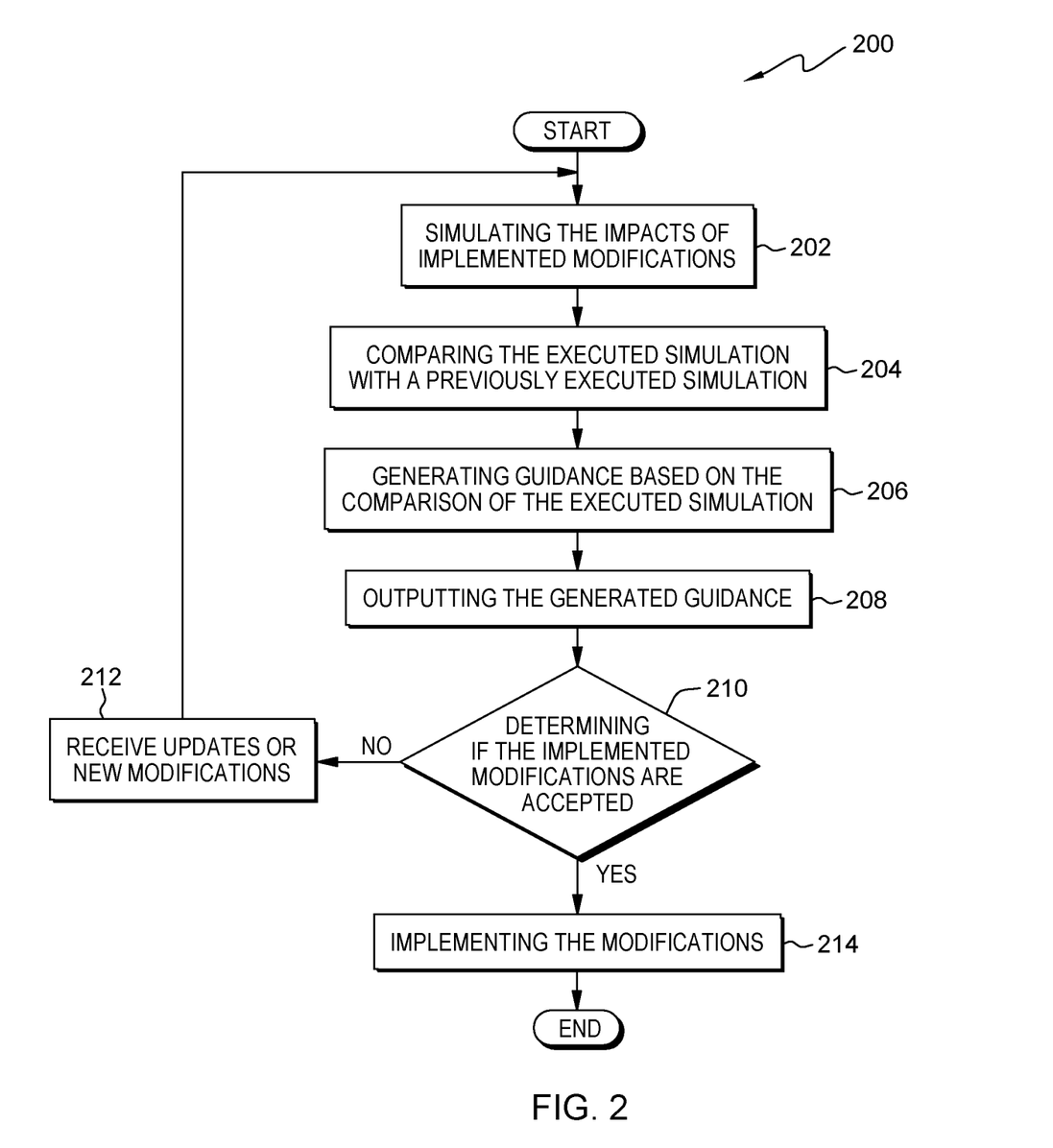
FIG. 2 illustrates operational steps of the program development and management component, on a server computer within the distributed data processing environment of FIGS. 1A-1B, for simulating and implementing program code modifications within a predetermined system, in accordance with an embodiment of the present invention.

FIG. 2 illustrates operational steps of component 122, generally designated 200, in communication with server computer 120, within distributed data processing environment 100 of FIG. 1A and/or FIG. 1B, for simulating and implementing program code modifications within a predetermined system, in accordance with an embodiment of the present invention. FIG. 2 provides an illustration of one implementation and does not imply any limitations with regard to the environments in which different embodiments may be implemented. Many modifications to the depicted environment may be made by those skilled in the art without departing from the scope of the invention as recited by the claims.

In step 202, component 122 simulates the impact of one or more implemented modifications. In various embodiments, components 122 simulates the impacts of software code modifications against one or more predetermined constraints using a target environment.

In step 204, component 122 compares the executed simulation against a previously executed simulation of the software code. In various embodiments, component 122 compares a current version of the software code, comprising the one or more implemented modifications, against one or more previously executed simulations of the software code.

In step 206, component 122 generates guidance for a user based on the comparison of the executed simulation. In various embodiments, component 122 generates guidance and/or feedback for a user, wherein the generated feedback comprises positive and negative impacts of the implemented software code modifications regarding compliance with one or more predetermined constraints.

In step 208, component 122 outputs the generated guidance to the user. In various embodiments, component 122 outputs the generated guidance to the user, via interface 106. In some embodiments, the generated and output weighted score can be a range. In other embodiments, the generated and output weighted score can be based on a predetermined threshold, wherein if the generated weighted score is above the predetermined threshold component 122 automatically accepts the changes and issues a notification prompt to the user that the modifications are compliant; however, it the generates weighted score is below the predetermined threshold then component 122 outputs an error message and/or responsive prompt notifying the user to correct the issue and outputs recommendations of how the user to bring the modifications and/or the code into compliance with the predetermined constraints. In various embodiments, component 122 generates and outputs a responsive prompt to the user, via interface 106, based on the generated guidance (e.g., feedback and recommendations 172), wherein the responsive prompt comprises one or more prompts querying the user to accept, modify, and/or cancel the implemented modifications to the code. In some embodiments, the responsive prompt may ask the user to implement custom feedback on the received guidance.

In step 210, component 122 determines if the implemented modifications are accepted by the user or system. In the depicted embodiment, if component 122 receives and/or retrieves a response from the user that the implemented modifications have been accepted (Yes step), then component 122 advances to step 214. However, in the depicted embodiment, if component 122 receives and/or retrieves a response from the user that the implemented modifications have not been accepted (No step), then component 122 advances to step 212.

In step 212, component 122 receives updates and/or new modifications to the software code. In various embodiments, responsive to receiving a rejection regarding the implemented modifications to the software code, component 122 receives updates and/or new modifications to the software code based the generated guidance above, wherein component 122 then repeats steps 202-210 using the received updates and/or new modifications.

In step 214, component 122 integrates the implemented software modifications. In various embodiments, responsive to receiving acceptance of the implemented software code modifications, component 122 integrates the software code modifications into the actual software code and moves the code along for development. In some embodiments, component 122 may execute the software code after the modifications have been integrated. In various embodiments, component 122 may receive varying degrees of acceptance (e.g., the user may accept the software code modifications whole or "in part" based on the guidance). For example, if the guidance provides excellent feedback and the software code and/or modifications to the software code meet the predetermined constraints then the user may accept the modifications as a whole. However, in this example, if the guidance indicates that the modifications are under a predetermined threshold of acceptance and do not comply with the predetermined constrains but the guidance provides a simple solution, then the user may accept the modifications in-part pending the solutions provided in the guidance.

Figure 3:
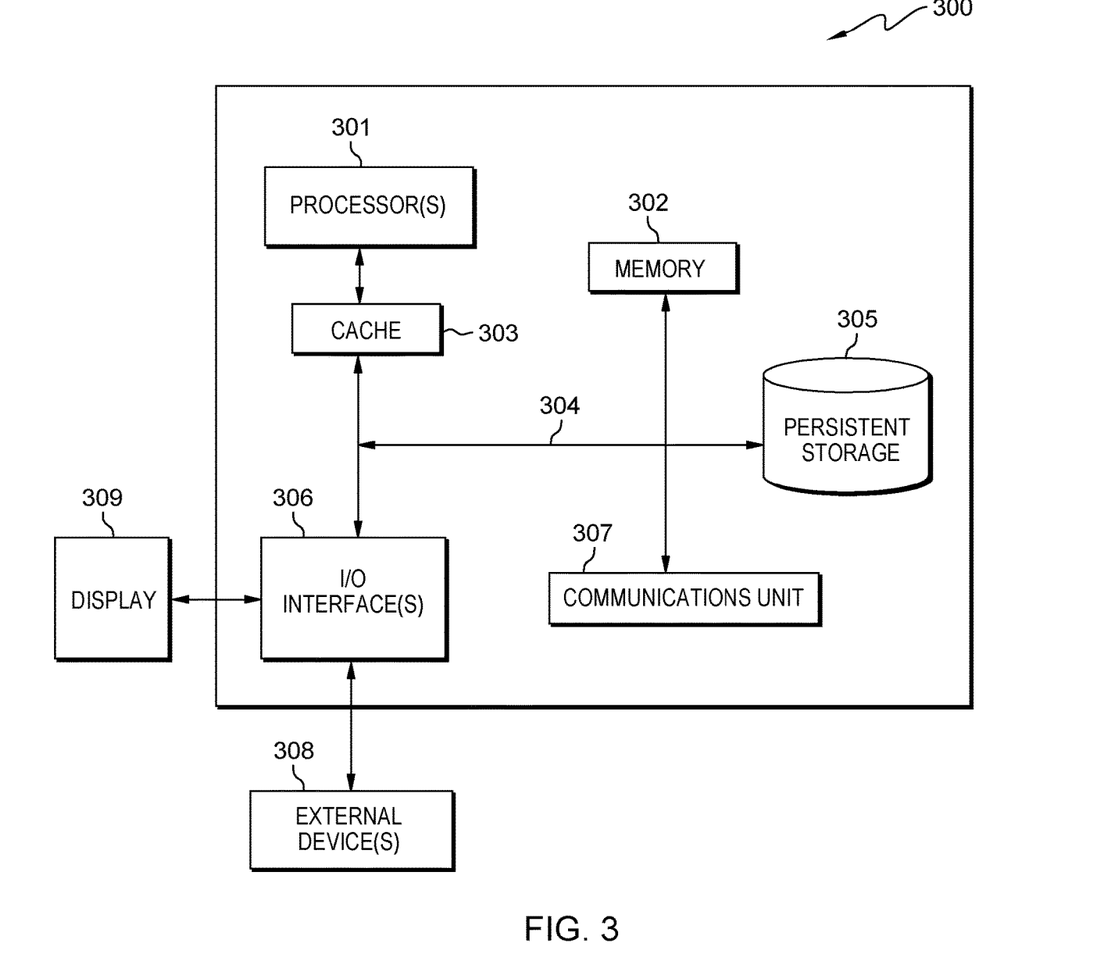
FIG. 3 depicts a block diagram of components of the server computer executing the program development and management component within the distributed data processing environment of FIGS. 1A-1B, in accordance with an embodiment of the present invention.

FIG. 3 depicts a block diagram of components of server computer 120 within distributed data processing environment 100 of FIG. 1A and/or FIG. 1B, in accordance with an embodiment of the present invention. It should be appreciated that FIG. 3 provides only an illustration of one implementation and does not imply any limitations with regard to the environments in which different embodiments may be implemented. Many modifications to the depicted environment may be made.

FIG. 3 depicts computer system 300, where server computing 120 represents an example of computer system 300 that includes component 122. The computer system includes processors 301, cache 303, memory 302, persistent storage 305, communications unit 307, input/output (I/O) interface(s) 306, display 309, external device(s) 308 and communications fabric 304. Communications fabric 304 provides communications between cache 303, memory 302, persistent storage 305, communications unit 307, and input/output (I/O) interface(s) 306. Communications fabric 304 may be implemented with any architecture designed for passing data and/or control information between processors (such as microprocessors, communications, and network processors, etc.), system memory, peripheral devices, and any other hardware components within a system. For example, communications fabric 304 may be implemented with one or more buses or a crossbar switch.

Memory 302 and persistent storage 305 are computer readable storage media. In this embodiment, memory 302 includes random access memory (RAM). In general, memory 302 may include any suitable volatile or non-volatile computer readable storage media. Cache 303 is a fast memory that enhances the performance of processors 301 by holding recently accessed data, and data near recently accessed data, from memory 302.

Program instructions and data used to practice embodiments of the present invention may be stored in persistent storage 305 and in memory 302 for execution by one or more of the respective processors 301 via cache 303. In an embodiment, persistent storage 305 includes a magnetic hard disk drive. Alternatively, or in addition to a magnetic hard disk drive, persistent storage 305 may include a solid-state hard drive, a semiconductor storage device, read-only memory (ROM), erasable programmable read-only memory (EPROM), flash memory, or any other computer readable storage media that is capable of storing program instructions or digital information.

The media used by persistent storage 305 may also be removable. For example, a removable hard drive may be used for persistent storage 305. Other examples include optical and magnetic disks, thumb drives, and smart cards that are inserted into a drive for transfer onto another computer readable storage medium that is also part of persistent storage 305.

Communications unit 307, in these examples, provides for communications with other data processing systems or devices. In these examples, communications unit 307 includes one or more network interface cards. Communications unit 307 may provide communications through the use of either or both physical and wireless communications links. Program instructions and data used to practice embodiments of the present invention may be downloaded to persistent storage 305 through communications unit 307.

I/O interface(s) 306 enables for input and output of data with other devices that may be connected to each computer system. For example, I/O interface 306 may provide a connection to external devices 308 such as a keyboard, keypad, a touch screen, and/or some other suitable input device. External devices 308 may also include portable computer readable storage media such as, for example, thumb drives, portable optical or magnetic disks, and memory cards. Software and data used to practice embodiments of the present invention may be stored on such portable computer readable storage media and may be loaded onto persistent storage 305 via I/O interface(s) 306. I/O interface(s) 306 also connect to display 309.

Display 309 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product. The computer program product may include a computer readable storage medium (or media) having computer readable program instructions thereon for causing a processor to carry out aspects of the present invention.

The computer readable storage medium may be any tangible device that may retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein may be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, may be implemented by computer readable program instructions.

These computer readable program instructions may be provided to a processor of a general-purpose computer, a special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that may direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus, or other device to produce a computer implemented process, such that the instructions which execute on the computer, other programmable apparatus, or other device implement the functions/acts specified in the flowchart and/or block diagram block or blocks.

The flowchart and block diagrams in the Figures (i.e., FIG.) illustrate the architecture, functionality, and operation of possible implementations of systems, methods, and computer program products according to various embodiments of the present invention. In this regard, each block in the flowchart or block diagrams may represent a module, a segment, or a portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A computer-implemented method for simulating and implementing modifications within a predetermined system, the computer-implemented method comprising:
   responsive to receiving instructions to submit a configuration request to a system emulator, submitting the configuration request to the system emulator so that the system emulator is configured to match predetermined constraints associated with a software code;
   generating, by a compiler, binary for the software code, wherein the binary comprises a unique identifier;
   simulating an impact of an implemented modification to the software code against the predetermined constraints using a target environment, wherein the simulating of the impact of the implemented modification comprises:
      executing, by the system emulator, the binary, wherein the system emulator collects metrics of the binary as the binary is being executed;
   identifying patterns between a first executed simulation against a second executed simulation of the software code;
   comparing a first executed simulation against a second executed simulation of the software code, wherein the second executed simulation comprises the implemented modifications and a current version of the software code;
   generating step by step guidance for a user based on the comparison of the first and second executed simulations, wherein the generated guidance comprises positive and negative impacts of the implemented software code modifications regarding compliance with the predetermined constraints; and
   outputting, by a user interface, the generated guidance to the user detailing the impact of the implemented modification.

2. The computer-implemented method of claim 1, further comprising:
   responsive to receiving acceptance of the implemented modifications, integrating the implemented modifications into the software code.

3. The computer-implemented method of claim 2, wherein the received acceptance is a varying degree of acceptance.

4. The computer-implemented method of claim 1, further comprising:
   responsive to determining the implemented modifications have not been accepted, receiving new modifications to the software code based on the generated guidance.

5. The computer-implemented method of claim 1, wherein the generated guidance comprises a weighted score based on predetermined measurements that creates a numerical visualization of how compliant the current version of the software code based on the implemented modifications to satisfy the predetermined constraint.

6. The computer-implemented method of claim 5, wherein the weighted score is based on a predetermined threshold, wherein the implemented modifications in the second simulation are automatically integrated when the weighted score is above the predetermined threshold.

7. The computer-implemented method of claim 1, further comprising:
   generating a responsive prompt; and
   outputting, by the user interface, the responsive prompt to the user based on the generated guidance, wherein the responsive prompt comprises one or more prompts querying the user to accept, modify, and/or cancel the implemented modifications to the software code.

8. A computer system for simulating and implementing modifications within a predetermined system, the computer system comprising:
   one or more computer processors;
   one or more computer readable storage devices;
   program instructions stored on the one or more computer readable storage devices for execution by at least one of the one or more computer processors, the stored program instructions comprising:
   responsive to receiving instructions to submit a configuration request to a system emulator, program instructions to submit the configuration request to the system emulator so that the system emulator is configured to match predetermined constraints associated with a software code;
   program instructions to generate, by a compiler, binary for the software code, wherein the binary comprises a unique identifier;
   program instructions to simulate an impact of an implemented modification to the software code against the predetermined constraints using a target environment, wherein the simulating of the impact of the implemented modification comprises:
      program instructions to execute, by the system emulator, the binary, wherein the system emulator collects metrics of the binary as the binary is being executed;
   program instructions to identify patterns between a first executed simulation against a second executed simulation of the software code;
   program instructions to compare a first executed simulation against a second executed simulation of the software code, wherein the second executed simulation comprises the implemented modifications and a current version of the software code;
   program instructions to generate a step by step guidance for a user based on the comparison of the first and second executed simulations, wherein the generated guidance comprises positive and negative impacts of the implemented software code modifications regarding compliance with predetermined constraints; and program instructions to output, by a user interface, the generated guidance to the user detailing the impact of the implemented modification.

9. The computer system of claim 8, further comprising:
responsive to receiving acceptance of the implemented modifications, program instructions to integrate the implemented modifications into the software code.

10. The computer system of claim 9, wherein the received acceptance is a varying degree of acceptance.

11. The computer system of claim 8, further comprising:
responsive to determining the implemented modifications have not been accepted, program instructions to receive new modifications to the software code based on the generated guidance.

12. The computer system of claim 8, wherein the generated guidance comprises a weighted score based on predetermined measurements that creates a numerical visualization of how compliant the current version of the software code based on the implemented modifications to satisfy the predetermined constraint.

13. The computer system of claim 12, wherein the weighted score is based on a predetermined threshold, wherein the implemented modifications in the second simulation are automatically integrated when the weighted score is above the predetermined threshold.

14. The computer system of claim 8, further comprising:
program instructions to generate a responsive prompt; and
program instructions to output, by the user interface, the responsive prompt to the user based on the generated guidance, wherein the responsive prompt comprises one or more prompts querying the user to accept, modify, and/or cancel the implemented modifications to the software code.

15. A computer program product for simulating and implementing modifications within a predetermined system, the computer program product comprising:
one or more computer readable storage medium and program instructions stored on the one or more computer readable storage medium, the stored program instructions comprising:
responsive to receiving instructions to submit a configuration request to a system emulator, program instructions to submit the configuration request to the system emulator so that the system emulator is configured to match predetermined constraints associated with a software code;
program instructions to generate, by a compiler, binary for the software code, wherein the binary comprises a unique identifier;
program instructions to simulate an impact of an implemented modification to the software code against the predetermined constraints using a target environment, wherein the simulating of the impact of the implemented modification comprises:
program instructions to execute, by the system emulator, the binary, wherein the system emulator collects metrics of the binary as the binary is being executed;
program instructions to identify patterns between a first executed simulation against a second executed simulation of the software code;
program instructions to compare a first executed simulation against a second executed simulation of the software code, wherein the second executed simulation comprises the implemented modifications and a current version of the software code;
program instructions to generate a step by step guidance for a user based on the comparison of the first and second executed simulations, wherein the generated guidance comprises positive and negative impacts of the implemented software code modifications regarding compliance with predetermined constraints; and
program instructions to output, by a user interface, the generated guidance to the user detailing the impact of the implemented modification.

16. The computer program product of claim 15, further comprising:
responsive to receiving acceptance of the implemented modifications, program instructions to integrate the implemented modifications into the software code, wherein the received acceptance is a varying degree of acceptance.

17. The computer program product of claim 15, further comprising:
responsive to determining the implemented modifications have not been accepted, program instructions to receive new modifications to the software code based on the generated guidance.

18. The computer program product of claim 15, wherein the generated guidance comprises a weighted score based on predetermined measurements that creates a numerical visualization of how compliant the current version of the software code based on the implemented modifications to satisfy the predetermined constraint.

19. The computer program product of claim 18, wherein the weighted score is based on a predetermined threshold, wherein the implemented modifications in the second simulation are automatically integrated when the weighted score is above the predetermined threshold.

20. The computer program product of claim 15, further comprising:
program instructions to generate a responsive prompt; and
program instructions to output, by the user interface, the responsive prompt to the user based on the generated guidance, wherein the responsive prompt comprises one or more prompts querying the user to accept, modify, and/or cancel the implemented modifications to the software code.

* * * * *